United States Patent
Chang et al.

(10) Patent No.: US 6,316,159 B1
(45) Date of Patent: Nov. 13, 2001

(54) CHEMICAL AMPLIFIED PHOTORESIST COMPOSITION

(75) Inventors: Shang-Wern Chang, Taipei; Yen-Cheng Li, Sanchung; Shang-Ho Lin, Taipei, all of (TW)

(73) Assignee: Everlight USA, Inc., Pineville, NC (US)

( * ) Notice: Subject to any disclaimer, the term of this patent is extended or adjusted under 35 U.S.C. 154(b) by 0 days.

(21) Appl. No.: 09/608,604

(22) Filed: Jun. 30, 2000

(30) Foreign Application Priority Data

Jun. 14, 2000 (TW) .................................. 8911160

(51) Int. Cl.$^7$ .................................. G03F 7/004
(52) U.S. Cl. .................. 430/270.1; 430/326; 430/913; 430/914
(58) Field of Search .................. 430/270.1, 913, 430/326, 914

(56) References Cited

U.S. PATENT DOCUMENTS 6,146,806 * 11/2000 Maeda et al. .................. 430/170
6,265,131 * 7/2001 Chang et al. .................. 430/270.1
6,284,429 * 9/2001 Kinsho et al. .................. 430/270.1

FOREIGN PATENT DOCUMENTS

1004568 * 5/2000 (EP) .................. C07C/69/54

* cited by examiner

Primary Examiner—Rosemary Ashton
(74) Attorney, Agent, or Firm—Bacon & Thomas

(57) ABSTRACT

A chemical amplified photoresist composition comprising a photosensitive polymer containing the following structure unit of formula (II):

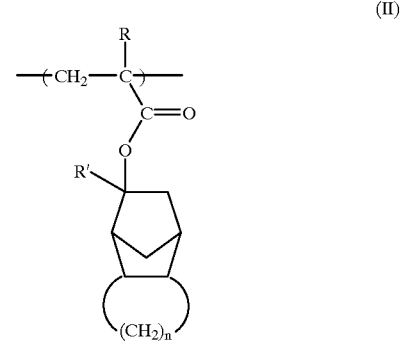

Wherein R is hydrogen or $C_1$–$C_4$ alkyl group; R' is $C_1$–$C_4$ alkyl group; n is an integer of 2, 3, 4, 5 or 6. This chemical amplified photoresist composition can be applied to general lithography processes, especially in 193 nm lithography and the patterns formed from the photoresist exhibit excellent resolution and photosensitivity.

28 Claims, No Drawings

US 6,316,159 B1

CHEMICAL AMPLIFIED PHOTORESIST COMPOSITION

FIELD OF THE INVENTION

The present invention relates to a chemical amplified photoresist composition. Especially relates to an improved lithographic chemical amplified photoresist composition and resin for using in the manufacture of integrated circuits.

BACKGROUND OF THE INVENTION

Current semiconductor industry trends indicate that availability of lithography below 0.18 μm is required for the development of high performance logic processors and 1-Gbit DRAM. In theory, there are two possible ways to get resist patterns with finer resolution, i.e. to shorten the wavelength of exposure light sources and to enlarge the numerical aperature (NA) of exposure systems.

KrF excimer laser (248 nm) steppers are widely used for the 0.25 μm UV lithography manufacturing process of semiconductor devices. Due to the improvement of optical elements such as high NA optical elements, phase shift mask, etc., the 248 nm KrF scanners now are capable of offering pilot run of 0.18 μm process and pioneer development of below 0.15 μm process. However, since there is a limit for wavelength shortening, the processing or manufacturing of finer masks becomes more and more difficult. To meet the urge demand of minimizing the size of IC devices, development of 193 nm (ArF excimer laser) lithography and resists are recognized as an alternative resolution recently.

Unfortunately, due to the strong absorption of aromatic rings that provides dry-etch resistance, the conventional chemical amplified resists based on phenol resin (248 nm) are totally opaque at 193 nm. To solve the problems, new polymers that exhibit low optical density at 193 nm are in great need now.

Generally speaking, the polymer, which is adequate candidate for the photoresist for 193 nm lithography, is required to meet six basic requirements:
(1) high transparency for 193 nm light source;
(2) good thermoplastic, ex. High glass transition temperature (Tg);
(3) high etch resistance;
(4) good adhesion and development for its composition;
(5) contained acid labile functional groups;
(6) be applied to general processes.

Recently, a tetrapolymer iBMA-MMA-tBMA-MMA (poly isobornyl methacrylate-methyl methacrylate -t-butyl methacrylate-methacrylic acid) is reported to be a possible resin system for ArF resist:

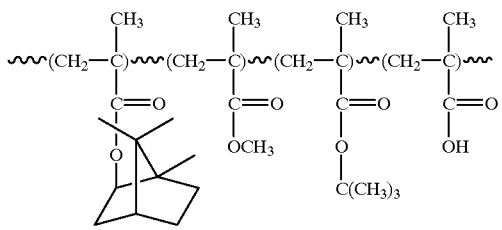

However, the tetrapolymer is also accompanied with undesirable adhesion and etch resistance. Therefore, a new resin for the compositions of resists is eager to be developed.

SUMMARY OF THE INVENTION

One object of the present invention is to provide a composition of chemical amplified photoresist, which is applied in microlithography or 193 nm ArF lithography with high resolution, advantageous pattern and high sensitivity.

The present invention provides a chemical amplified photoresist composition, which comprises a photosensitive polymer containing the following structure unit of formula (II):

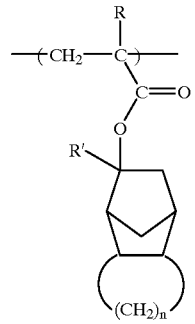

Wherein R is hydrogen or $C_1$–$C_4$ alkyl group; R' is $C_1$–$C_4$ alkyl group; n is an integer of 2, 3, 4, 5 or 6.

The chemical amplified photoresist composition of the present invention is comprised of the photosensitive polymer containing the above structure unit of formula (II) as the major component and can be optionally mixed with photoacid generator (PAG), acid quencher, additives and solvent.

The chemical amplified photoresist compositions of the present invention can be used in lithography, especially 193 nm lithography. The resolution, shape and sensitivity of the resist pattern formed from the photoresist composition of the present invention are excellent.

DETAILED DESCRIPTION OF THE INVENTION

The photosensitive polymer containing the structure unit of formula (II) can be prepared from the following formula (I) compound:

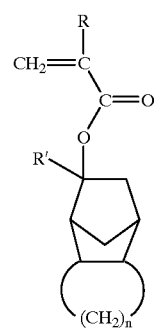

Wherein R is hydrogen or $C_1$–$C_4$ alkyl group; R' is $C_1$–$C_4$ alkyl group; n is an integer of 2, 3, 4, 5 or 6.

Preferably, compound (I) is a monomer of polycycloalkyl acrylate which can be obtained from the of reaction of acryloyl chloride and tricycloalcohol or its derivatives.

Compound (I) can copolymerized with other vinyl monomers to form various copolymers with or without the assistance of catalysts.

There is no special limit for the application of the polymers or copolymers. However, if the polymers polymerized or copolymerized from compound (I) are expected to be transparent for the radiation with 193 nm wavelength, vinyl monomers free of aromatic rings are preferred.

Vinyl monomers suitable to copolymerized with compound (I) can be

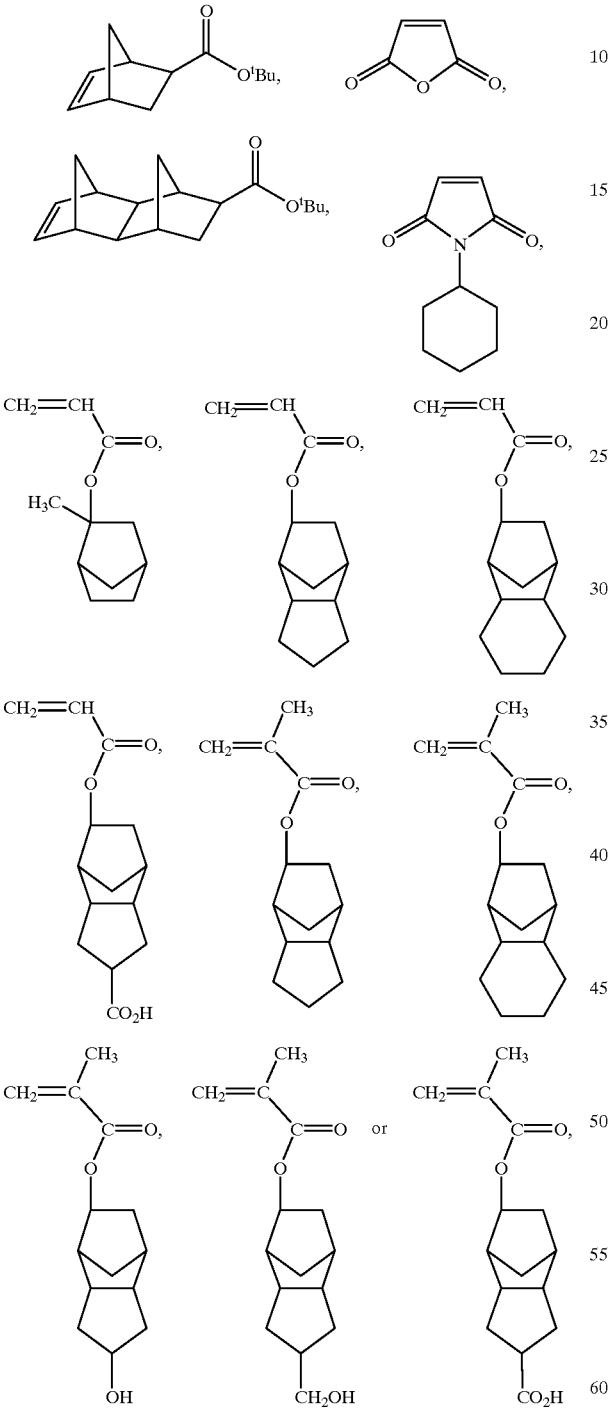

The polymers or copolymers polymerized or copolymerized from compound (I) contain the following structure unit of formula (II):

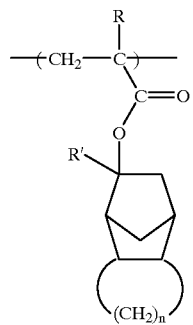

(II)

Wherein R is hydrogen or $C_1$–$C_4$ alkyl group; R' is $C_1$–$C_4$ alkyl group; n is an integer of 2, 3, 4, 5 or 6.

The structure unit of the polymers or copolymers polymerized or copolymerized from compound (I) can be The structure unit of the polymers or copolymers polymerized or copolymerized from compound (I) can be

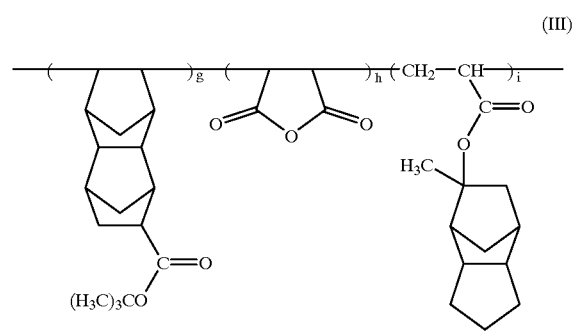

(III)

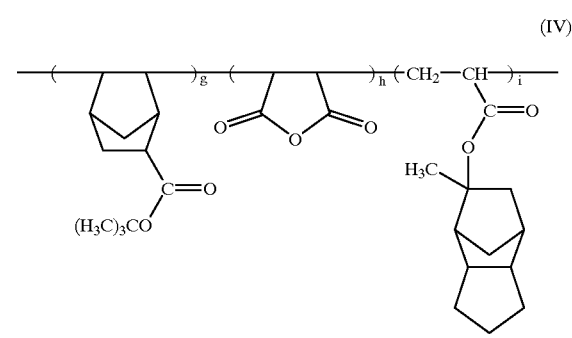

(IV)

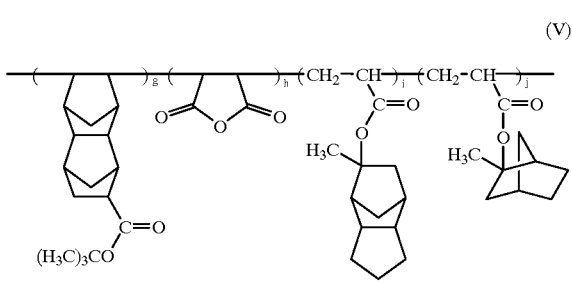

(V)

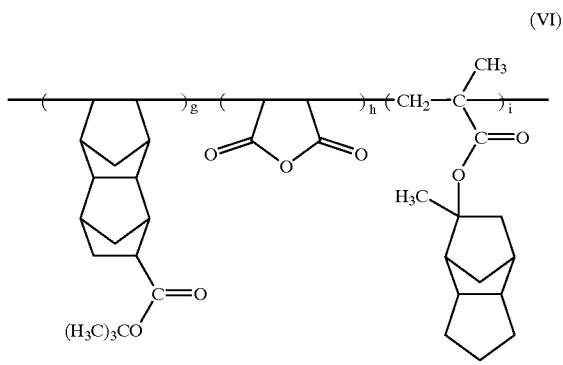
(VI)

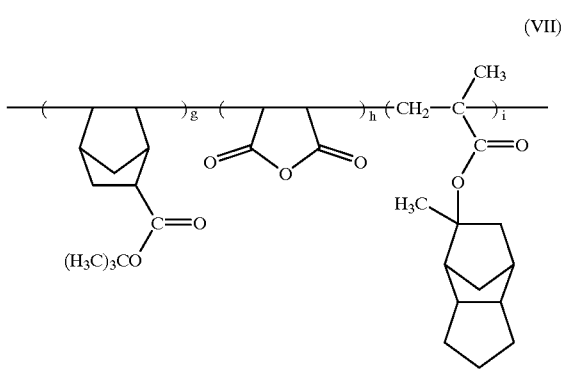
(VII)

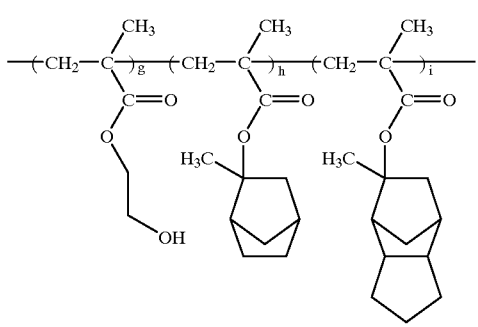
(VIII)

in the above structure unit of formula (III), (IV), (VI), (VII) and (VIII), wherein g+h+i=1, more preferably g/(g+h+i)= 0.1–0.5, h/(g+h+i)=0.1–0.5, and i/(g+h+i)=0.1–0.5; in the above structure unit of formula (V), wherein g+h+i+j=1, more preferably g/(g+h+i+j)=0.1–0.5, h/(g+h+i+j)=0.1–0.5, i/(g+h+i+j)=0.1–0.5, and j/(g+h+i+j)=0.1–0.5.

There is no special limit for the synthetical method of the polymers or copolymers from compound (I) of the present invention. Preferably, the polymerization or copolymerization of compound (I) or its mixture is initiated by initiators. Initiator used here can be any initiator used by the people who are skilled in the art. Preferably, the initiator is 2,2'-azo-bis-isobutyronitrile(AIBN) or dimethyl-2,2'-azo-bis-isobutyrate radical initiator (V-601).

The photosensitive polymer containing the structure unit of formula (II) can combine with adequate photo-acid generator (PAG), acid quencher, additives or solvent to form chemical amplified photoresist compositions.

There is no special limit to photo-acid generators here. The acid created by UV illuminating will be allowed. The photo-acid generator suitable for the chemical amplified photoresist compositions of the present invention meet the requirement to maintain stable before exposure. Preferably, suitable photo-acid generator is

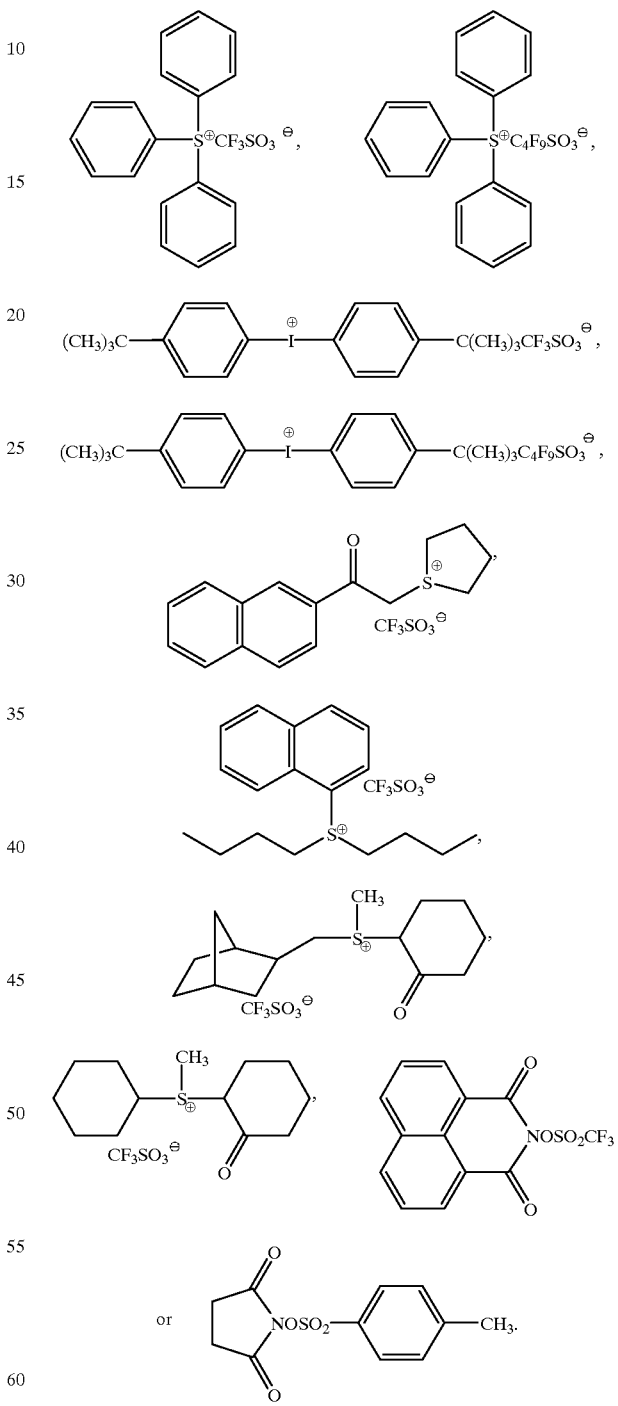

The chemical amplified photoresist composition of the present invention can further include acid scavengers to adjust the diffusion of acid. Suitable acid scavengers can be

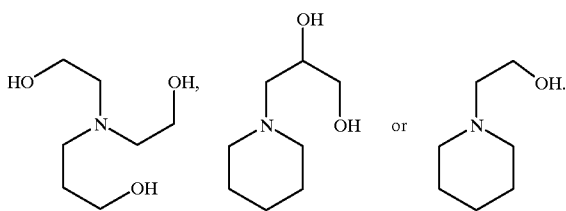

The chemical amplified photoresist composition of the present invention can further include other additives to enhance the resistance of the resist surface to basic materials. In addition, surfactants can be added to the chemical amplified photoresist compositions of the present invention to improve characters of the coating formed from the compositions.

There is no special limit to the solvent of the chemical amplified photoresist compositions of the present invention. Preferably, the solvent suitable for the chemical amplified photoresist compositions of the present invention is higher alcohol (e.g. n-octanol), glycolic acid and its derivatives (e.g. methyl lactate, ethyl lactate and ethyl glycolate), glycollic ether and its derivatives (e.g. glycollic ethyl acetate, glycollic methyl acetate, glycerol methyl acetate), ketoesters (e.g. methyl acetoacetate, ethyl acetoacetate), alkoxy carboxylates (ethyl 2-ethoxyacetate, methyl 3-methoxypropionate, ethyl 3-ethoxypropionate, or methyl ethoxypropionate), ketones (methyl ethyl ketone, methyl pentyl ketone, acetylacetone cyclopentone, cyclohexone, or 2-hepatone) ketoethers (e.g. diacetoalcohol methyl ether), ketoalcohols (e.g. acetoalcohol or diacetone ), alcohol ethers (e.g. glycollic butyl ether or propylene glycol ethyl ether) amides (e.g. dimethylacetamide or dimethyl formamide), ethers (e.g. phenyl ether or triethylene glycol dimethyl ether) or mixture thereof. Preferably, the solvent of the chemical amplified photoresist is n-octyl alcohol, propylene glycol methyl ether acetate, ethyl 2-ethoxyacetate, methyl 3-methoxypropionate, methylethoxypropionate, methyl ethyl ketone, methylpentylmethyl ketone, cyclopentanone, methyl acetate, ethyl acetate, glycollic butyl ether propylene glycol ethyl ether or mixture thereof.

The chemical amplified photoresist of the present invention can be obtained by simply mixing the components together. There is no limit for the mixing methods. The chemical amplified photoresist compositions of the present invention can be made by either adding other components into the solution of the photosensitive polymers (or copolymers) or adding the photosensitive polymers (or copolymers) into the solution of other components.

The impurities (e.g. trace amount of metal cations or halides) of the chemical amplified photoresist compositions of the present invention should be removed as good as possible. The impurities in the components of the chemical amplified photoresist composition of the present invention can be removed before or after the components are mixed together.

The chemical amplified photoresist compositions of the present invention can be used in the process of lithography. Especially, the chemical amplified photoresist compositions of the present invention can be used in the process of 193 nm (ArF excimer laser) lithography. After the chemical amplified photoresist compositions of the present invention are proceeded through normal lithographic procedures such as coating, exposure and development, patterns on substrates will form. As he chemical amplified photoresist compositions of the present invention are used, the compositions are coated on a substrate first. Then the coating is baked to remove solvents, and exposed to light source under masks to form patterns. The substrate used for 193 nm lithography here can be silicon or other materials. The coating methods to coat the chemical amplified photoresist compositions of the present invention on substrates can be spin coating, spray coating and roll coating.

The developing solutions for the exposed resist coating can be ammonium, triethylamine, dimethylaminomethanol, hydroxylamine, sodium hydroxide, potassium hydroxide, sodium carbonate, potassium carbonate or trimethylhydroxylethylamonium hydroxide.

The resolution, shape and sensitivity of the chemical amplified photoresist composition of the present invention are good. Besides, the depth of focus, exposure border and removing border are excellent.

Preparation Example 1

Synthesis of 8-methyl tricyclo [5.2.1.0$^{2,6}$] decan-8-yl methylacrylate (formula (I-1))

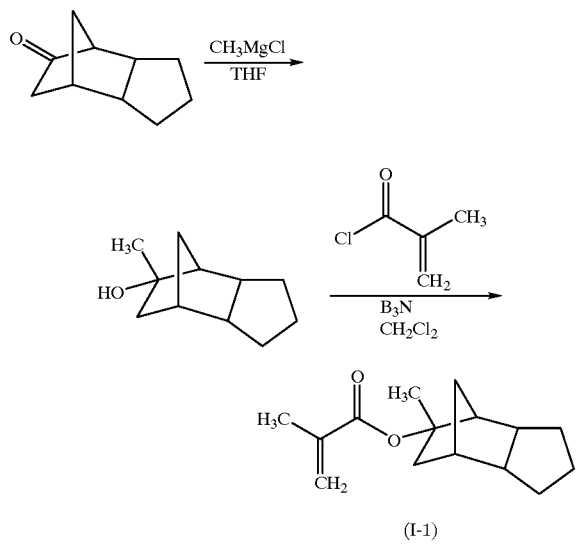

(A) Synthesis of 8-methyl-tricyclo [5.2.1.0$^{2,6}$] decan-8-ol (formula (X))

Tricyclo [5.2.1.0$^{2,6}$] decan-8-one (15.0 g) in tetrahydrofuran (THF, 50 ml) is slowly added into CH$_3$MgCl (9.7 g) in THF and the reaction mixture is stirred completely. Tetrahydrofuran (THF, 100 ml) with 5% of water is added into the reaction mixture. Then 100 ml of water is added to the reaction mixture. The reaction mixture is extracted by ether. The organic extract is concentrated in vacuo to yield 8-methyl-tricyclo [5.2.1.0$^{2,6}$] decan-8-ol (formula (X)) as white solid.

$^1$H-NMR (CDCl$_3$, 300 MHz) δ2.60–2.45 (1H, m), 1.90–1.50 (8H, m), 1.28 (3H, s), 1.40–0.80 (5H, m).

$^{13}$C-NMR (CDCl$_3$, 75 MHz) δ76.9, 52.8, 46.8, 46.5, 41.8, 39.3, 32.7, 32.4, 31.8, 30.4, 27.4.

(B) Synthesis of 8-methyl tricycle [5.2.1.0$^{2,6}$] decan-8-yl methacrylate (formula (I-1))

Methacryloyl chloride (20.9 g) and triethyl amine (20.2 g) is added to 8-methyl tricycle [5.2.1.0$^{2,6}$] deccan-8-ol (20.0 g) in dichloromethane (200 ml) and the reaction mixture is stirred completely. Then 20 ml of water is added to the reaction mixture. Separating the CH$_2$Cl$_2$ and water layers, then the water layer was extracted with CH$_2$Cl$_2$ (200 mL×3). The organic layer was combined then wash with water till pH=7, dried over MgSO$_4$ and evaporated to dryness. The residue was purified by flash column on silica gel (n-hexane), the filtrate was evaporated to obtain 8-methyl tricyclo[5.2.1.0$^{2,6}$] decan-8-yl methacrylate. (20 g, formula (I-1))

$^1$H-NMR (CDCl$_3$, 300 MHz) δ5.95 (1H, brs), 5.41 (1H, brs), 2.35–2.00 (2H, m), 1.84 (3H, s), 1.84–1.51 (8H, m), 1.47 (3H, s), 1.46–0.80 (6H, m).

$^{13}$C -NMR (CDCl$_3$, 75 MHz) δ166.5, 137.4, 124.2, 86.4, 51.4, 46.6, 45.0, 40.6, 39.8, 32.4, 31.6, 31.1, 27.2, 25.5, 18.3.

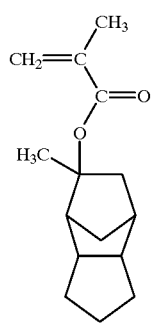

(I-1)

Application Example 2

Synthesis of 8-methyl tricyclo [5.2.1.0$^{2,6}$] decan-8-yl acryloylate) (formula (I-2))

The procedure is as same as that of example 1 except methacryloyl chloride is replaced by acryloyl chloride (18.1 g). The product 8-methyl-tricyclo [5.2.1.0$^{2,6}$] decan-8-yl acrylate (18.5 g) (formula (I-2)) as colorless oil is obtained.

$^1$H-NMR (CDCl$_3$, 300 MHz) δ6.19 (1H, dd, 17.3, 1.74), 5.90 (1H, dd, 17.3, 10.3) 5.61 (1H, dd, 10.3, 1.74), 2.29–1.44 (8H, m), 1.42 (3H, s), 1.40–0.84 (6H, m).

$^{13}$C -NMR (CDCl$_3$, 75 MHz) δ165.4, 129.8, 129.32, 86.6, 51.3, 46.6, 45.0, 40.6, 39.8, 32.4, 31.6, 31.2, 27.2, 25.5.

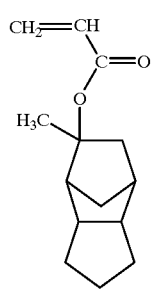

(I-2)

Application Example 3

Synthesis of Photosensitive Polymer Containing the Structure Unit of Formula (III)

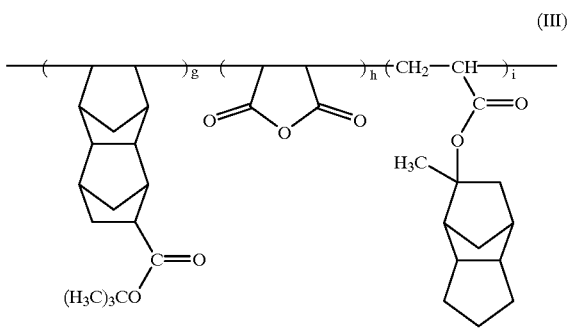

(III)

The initiator (4.92 g, 2,2'-azo-bis-isobutyronitrile; AIBN) is added to the mixture of tetrahydrofuran (60 ml), tert-butyl tetracyclo [4.4.0.1$^{2,5}$. 1$^{7,12}$] dodec-3-ene-5-carboxylate (26 g), 8-methyl tricyclo [5.2.1.0$^{2,6}$] decan-8-yl acryloylate (23.4 g) and maleic anhydride (formula I-2, 9.8 g), then the mixture is heated to 70° C. and stirred overnight. Tetrahydrofuran (20 ml) is added to the mixture. After the resulted product mixture (20 ml) is added to 1 l of hexane dropwise and slowly, a white solid precipitate is obtained. The white solid is collected by filtration and dried to yield 30.23 g (51%) of the photosensitive polymer containing the structure unit of formula (III), weight-average molecular weight 10875 (measured by GPC), glass transition temperature Tg=183° C., degradation temperature Td=212° C.

Application Example 4

Synthesis of Photosensitive Polymer Containing the Structure Unit of Formula (IV)

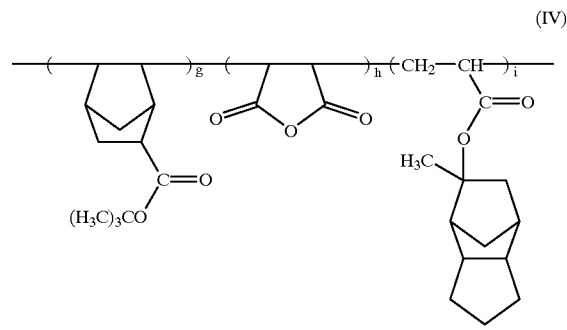

(IV)

The initiator (4.92 g, 2,2'-azo-bis-isobutyronitrile; AIBN) is added to the mixture of tetrahydrofuran (27 ml), tert-butyl tetracyclo [2.2.1]hept-2-ene-5-carboxylate (9.71 g), 8-methyl tricyclo [5.2.1.0$^{2,6}$] decan-8-yl acryloylate (11.7 g) and maleic anhydride (4.9 g), then the mixture is heated to 70° C. and stirred overnight. Tetrahydrofuran (20 ml) is added to the mixture. After the resluted mixture (20 ml) is added to 1,000 ml of hexane dropwise and slowly, a white solid precipitate is obtained. The white solid is collected by filtration and dried to yield 14.31 g (54.4%) of photosensitive polymer containing the structure unit of formula (IV), weight-average molecular weight 9660(measured by GPC), glass transition temperature Tg=180° C., degradation temperature Td=210° C.

Application Example 5

Synthesis of Photosensitive Polymer Containing the Structure Unit of Formula (V)

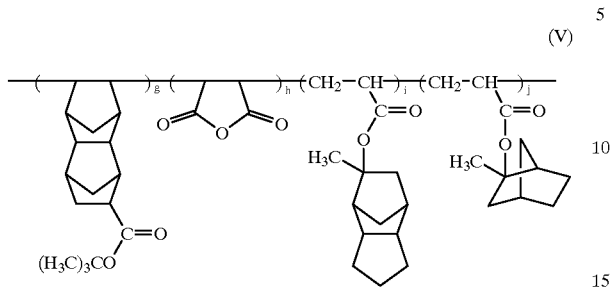

(V)

The initiator (4.92 g, 2,2'-azo-bis-isobutyronitrile; AIBN) is added to the mixture of tetrahydrofuran (28 ml), tert-butyl tetracyclo $[4.4.0.1^{2,5}.1^{7,12}]$ dodecan-3-ene-5-carboxylate (6.5 g), 8-methyl tricyclo $[5.2.1.0^{2,6}]$ decan-8-yl acryloylate (9.7 g), 2-methyl bicyclo [2.2.1] heptan-2-yl acrylate (6.16 g) and maleic anhydride (4.9 g), then the mixture is heated to 70° C. and stirred overnight. Tetrahydrofuran (20 ml) is added to the mixture. After 20 ml of the resulted mixture is added to 1,000 ml of hexane dropwise and slowly, a white solid precipitate is obtained. The white solid is collected by filtration and dried to yield 16.58 g (54.4%) of photosensitive polymer containing the structure unit of formula (V), weight-average molecular weight 10428 (measured by GPC), glass transition temperature Tg=161° C., degradation temperature Td=208° C.

Application Example 6

Synthesis of Photosensitive Polymer Containing the Structure Unit of Formula (VI)

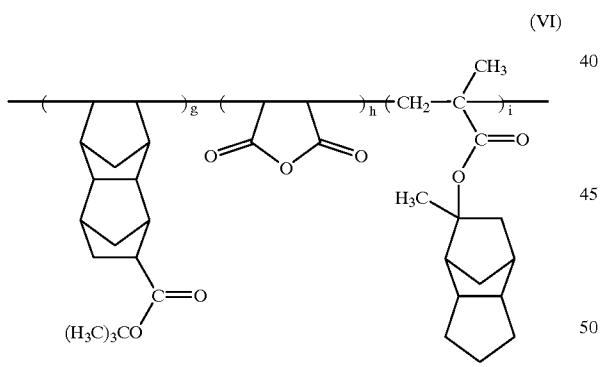

(VI)

The initiator (4.92 g, 2,2'-azo-bis-isobutyronitrile; AIBN) is added to the mixture of tetrahydrofuran (60 ml), tert-butyl tetracyclo $[4.4.0.1^{2,5}.1^{7,12}]$ dodecan-3-ene-5-carboxylate (26 g), 8-methyl tricyclo $[5.2.1.0^{2,6}]$ decan-8-yl acryloylate (23.4 g) and maleic anhydride (9.8 g). Then the mixture is heated to 70° C. and stirred overnight. Tetrahydrofuran (20 ml) is added to the mixture. After 20 ml of the resulted mixture is added to 1,000 ml of hexane dropwise and slowly, a white solid precipitate is obtained. The white solid is collected by filtration and then dried to yield 28.89 g (32%) of photosensitive polymer containing the structure unit of formula (VI), weight-average molecular weight 29810 (measured by GPC), glass transition temperature Tg =178° C., degradation temperature Td=209° C.

Application Example 7

Synthesis of Photosensitive Polymer Containing the Structure Unit of Formula (VII)

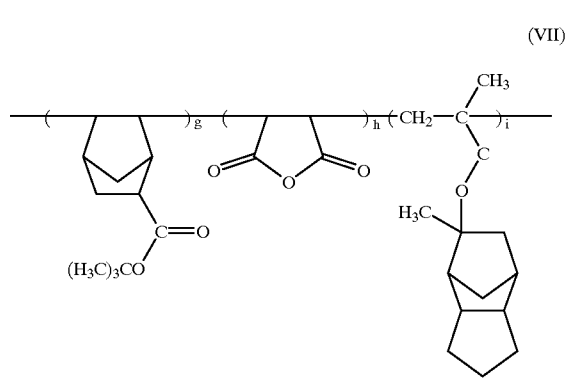

(VII)

The initiator (4.92 g, 2,2'-azo-bis-isobutyronitrile; AIBN) is added to the mixture of tetrahydrofuran (20 ml), tert-butyl tetracyclo [2.2.1]heptan-2-ene-5-carboxylate (9.71 g), 8-methyl tricyclo $[5.2.1.0^{2,6}]$ decan-8-yl acryloylate(12.5 g) and maleic anhydride (4.9 g). Then the mixture is heated to 70° C. and stirred overnight. Tetrahydrofuran (20 ml) is added to the mixture. After 20 ml of the resulted mixture is added to 1,000 ml of hexane dropwise and slowly, a white solid precipitate is obtained. The white solid is collected by filtration and then dried to yield 11.25 g (46.3%) of photosensitive polymer containing the structure unit of formula (VII), weight-average molecular weight 8379 (measured by GPC), glass transition temperature Tg=190° C., degradation temperature Td=213° C.

Application Example 8

Synthesis of Photosensitive Polymer Containing the Structure Unit of Formula (VIII)

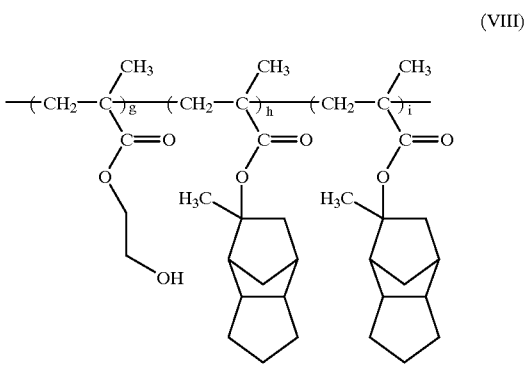

(VIII)

The initiator (4.92 g, 2,2'-azo-bis-isobutyronitrile; AIBN) is added to the mixture of tetrahydrofuran (27 ml), 8-methyl tricyclo $[5.2.1.0^{2,6}]$ decan-8-yl acryloylate (11.7 g), 2-methyl bicyclo [2.2.1] heptan-2-yl acrylate (9.7 g) and 2-hydroxyethyl methacrylate (6.5 g). Then the mixture is heated to 70° C. and stirred overnight. Tetrahydrofuran (20 ml) is added to the mixture. After 20 ml of the resulted mixture is added to 1,000 ml of hexane dropwise and slowly, a white solid precipitate is obtained. The white solid is collected by filtration and then dried to yield 17.30 g (62.0%) of photosensitive polymer containing the structure unit of formula (VIII), weight-average molecular weight 15632(measured by GPC), glass transition temperature Tg=175° C., degradation temperature Td=210° C.

EXAMPLE 1

Photoresist Composition

Triphenylsulfonium perfluoro-1-butanesul-fonate (TPS-PFBS, 0.05 g), tert -butyl cholate (TBC, 0.06 g), propylene glycol monomethyl ether acetate (10.4 g), polymer (III) (2 g, obtained from example 3) and N-(hydroxy methyl) piperidine (0.5mg) polymer are mixed together and filtered by a 0.45 μm filter. The resulted solution is spin coated on a silicon substrate by 2200 rpm for 30 sec.

The coated substrate is dried at 130° C. for 90 seconds. The thickness of the coating is 436.8 nm. The coated substrate is exposed under 193 nm, 10~30 mj/cm$^2$ deep UV radiation and then baked on heating plate at 130° C. for 90 sec.

The exposed coating is developed by an aqueous solution of 2.38% tetramethyl ammonium hydroxide (TMAH). After the coated substrate is washed by deionized water and dried, the exposed area shows a structure of resolution of 0.15 μm under the observation of scanning electronic microscopy (SEM).

EXAMPLE 2 to 5

Photoresist Compositions

The procedure here is as same as that of example 1 except that photosensitive polymer containing the structure unit of formula (III) is replaced by photosensitive polymer containing the structure unit of formula (IV), (V), (VI) and (VIII). The result is shown in table 1.

TABLE 1

| example | Thickness of film (nm) | Resolution (μm) |
|---|---|---|
| 10 | 421.5 | 0.15 μm |
| 11 | 385.2 | 0.15 μm |
| 12 | 398.7 | 0.20 μm |
| 13 | 452.3 | 0.15 μm |

The chemical amplified photoresist composition of the present invention can be used in lithography, especially 193 nm lithography. The resolution, shape and sensitivity of the resist pattern formed from the photoresist composition of the present invention are excellent.

From the foregoing description, one skilled in the art can easily ascertain the essential characteristics of this invention, and without departing from the scope thereof, can make various changes and modifications of the invention to adapt it to various usages and conditions. Thus, other embodiments are also within the claims.

What is claimed is:

1. A chemically amplified photoresist composition which comprises a photosensitive polymer which contains a structural unit of formula (III)

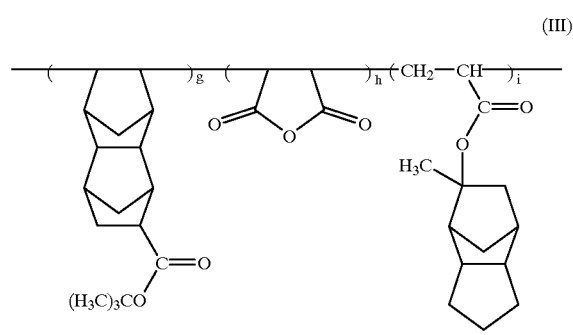

wherein g+h+i=1.

2. The composition of claim 1, wherein g/(g+h+i)= 0.1–0.5, h/(g+h+i)=0.1–0.5, and i/(g+h+i)=0.1–0.5.

3. The composition of claim 1, wherein the glass transition temperature Tg of said polymer ranges from 20° C. to 210° C., the molecular weight of the polymer ranges from 1,000 to 500,000, the degradation temperature Td of the polymer is greater than 80° C. and the polymer is soluble in organic solvent.

4. The composition of claim 1, further comprising a photo-acid generator (PAG), said photo-acid generator is selected from the group consisting of:

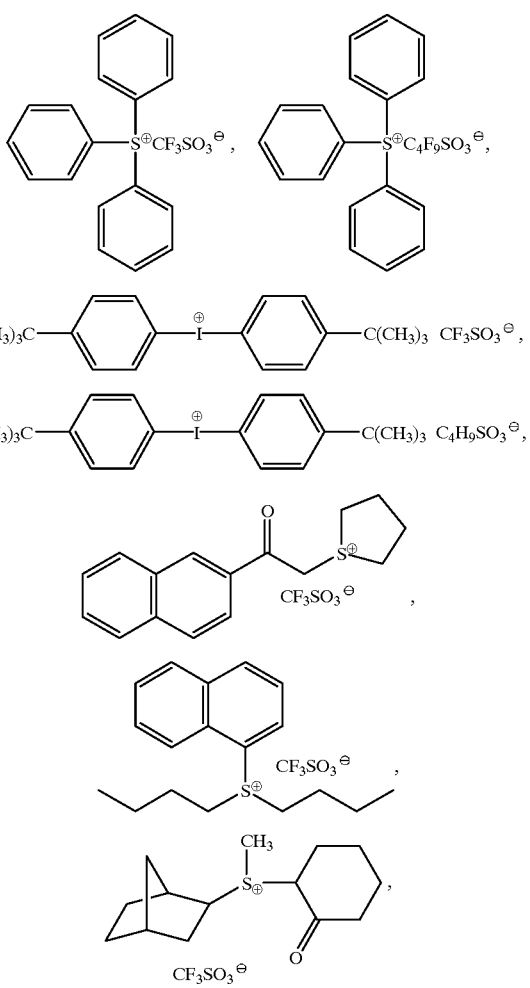

-continued

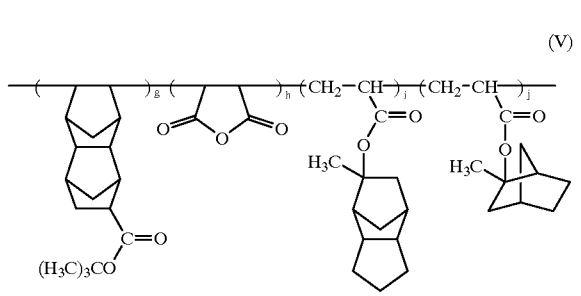

5. The composition of claim 4, further comprising an acid quencher, said acid quencher is selected from the group consisting of:

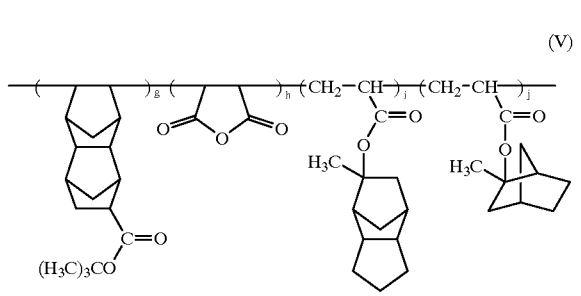

6. A method for the lithography of a semiconductor device wherein the composition as claimed in claim 1 is coated on a substrate and is used as a chemical amplified photoresist.

7. The method of claim 6, wherein said lithography comprises an exposure step using a light source with 248 nm or 193 nm.

8. A chemically amplified photoresist composition which comprises a photosensitive polymer which contains a structural unit of formula (V)

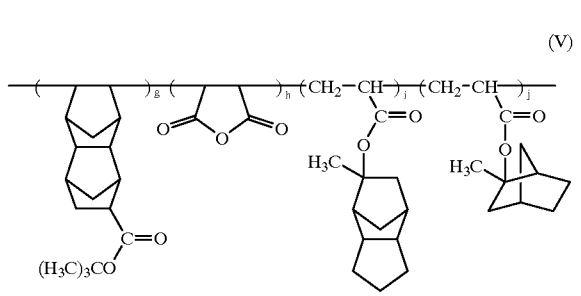

wherein g+h+i+j=1.

9. The composition of claim 8, wherein g/(g+h+i+j)= 0.1–0.5, h/(g+h+i+j)=0.1–0.5, i/(g+h+i+j)=0.1–0.5, and j/(g+h+i+j)=0.1–0.5.

10. The composition of claim 8, wherein the glass transition temperature Tg of said polymer ranges from 20° C. to 210° C., the molecular weight of the polymer ranges from 1,000 to 500,000, the degradation temperature Td of the polymer is greater than 80° C. and the polymer is soluble in organic solvent.

11. The composition of claim 8, further comprising a photo-acid generator (PAG), said photo-acid generator is selected from the group consisting of:

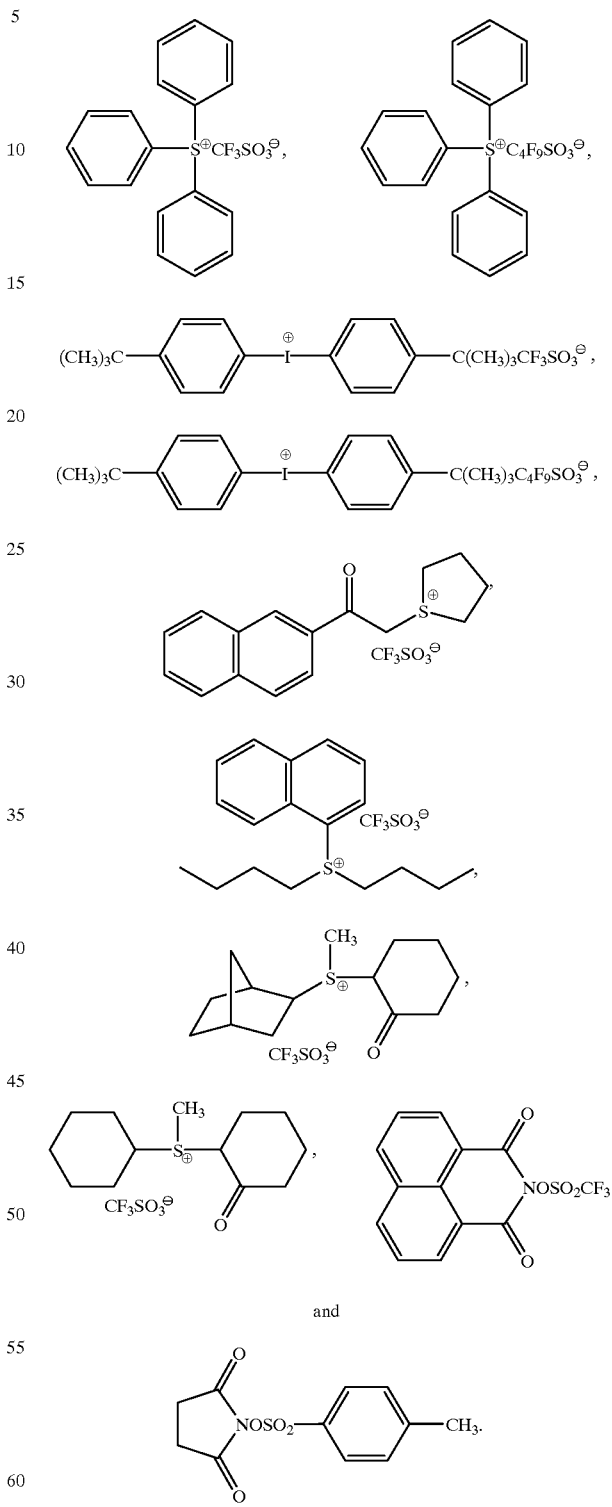

12. The composition of claim 11, further comprising an acid quencher, said acid quencher is selected from the group consisting of:

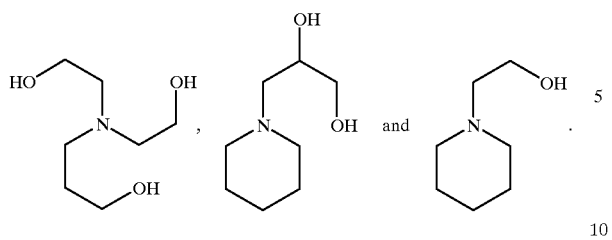

13. A method for the lithography of a semiconductor device wherein the composition as claimed in claim 8 is coated on a substrate and is used as a chemical amplified photoresist.

14. The method of claim 13, wherein said lithography comprises an exposure step using a light source with 248 nm or 193 nm.

15. A chemically amplified photoresist composition which comprises a photosensitive polymer which contains a structural unit of formula (VI)

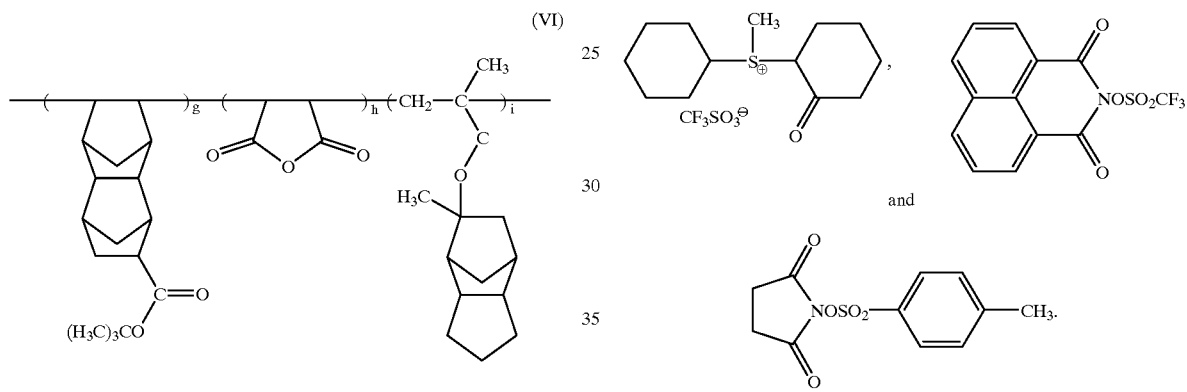

wherein g+h+i=1.

16. The composition of claim 15, wherein g/(g+h+i)= 0.1–0.5, h/(g+h+i)=0.1–0.5, and i/(g+h+i)=0.1–0.5.

17. The composition of claim 15, wherein the glass transition temperature Tg of said polymer ranges from 20° C. to 210° C., the molecular weight of the polymer ranges from 1,000 to 500,000, the degradation temperature Td of the polymer is greater than 80° C. and the polymer is soluble in organic solvent.

18. The composition of claim 15, further comprising a photo-acid generator (PAG), said photo-acid generator is selected from the group consisting of:

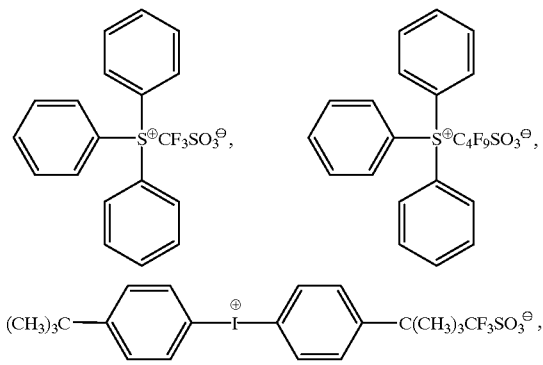

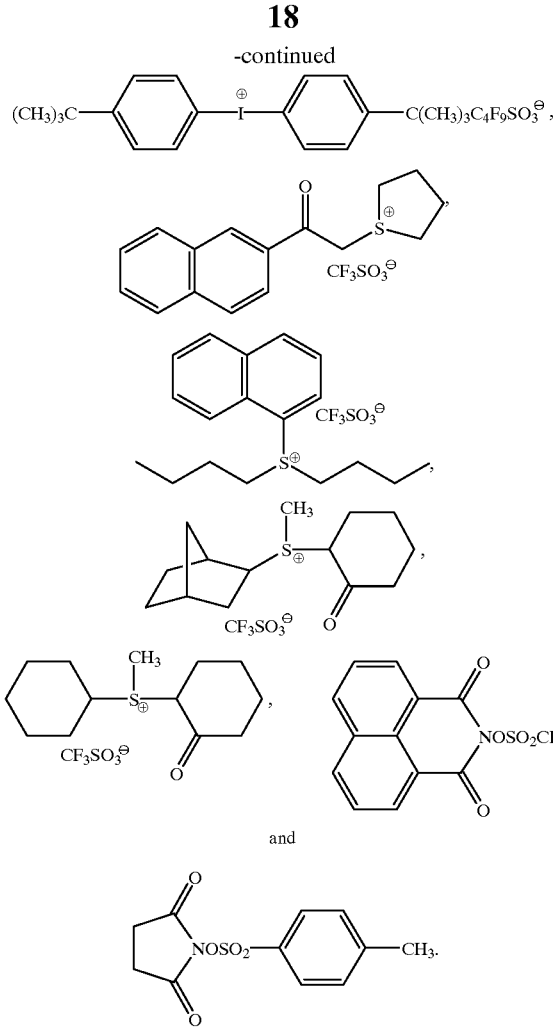

19. The composition of claim 18, further comprising an acid quencher, said acid quencher is selected from the group consisting of:

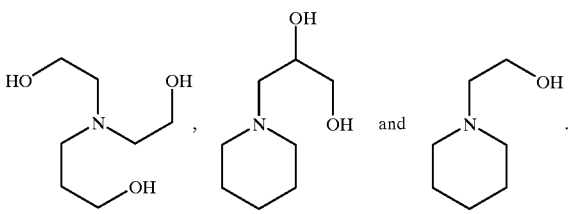

20. A method for the lithography of a semiconductor device wherein the composition as claimed in claim 15 is coated on a substrate and is used as a chemical amplified photoresist.

21. The method of claim 20, wherein said lithography comprises an exposure step using a light source with 248 nm or 193 nm.

22. A chemically amplified photoresist composition which comprises a photosensitive polymer which contains a structural unit of formula (VIII)

(VIII)

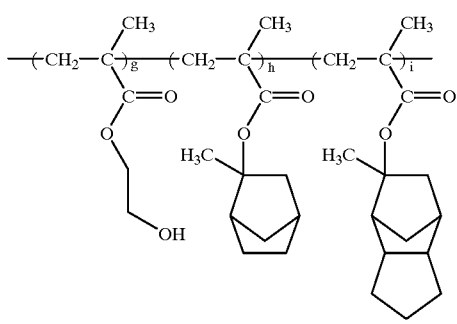

wherein g+h+i=1.

23. The composition of claim 22, wherein g/(g+h+i)=0.1–0.5, h/(g+h+i)=0.1–0.5, and i/(g+h+i)=0.1–0.5.

24. The composition of claim 22, wherein the glass transition temperature Tg of said polymer ranges from 20° C. to 210° C., the molecular weight of the polymer ranges from 1,000 to 500,000, the degradation temperature Td of the polymer is greater than 80° C. and the polymer is soluble in organic solvent.

25. The composition of claim 22, further comprising a photo-acid generator (PAG), said photo-acid generator is selected from the group consisting of:

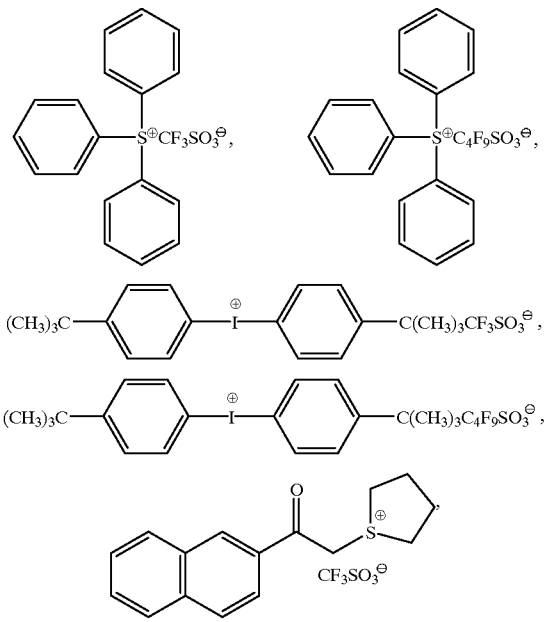

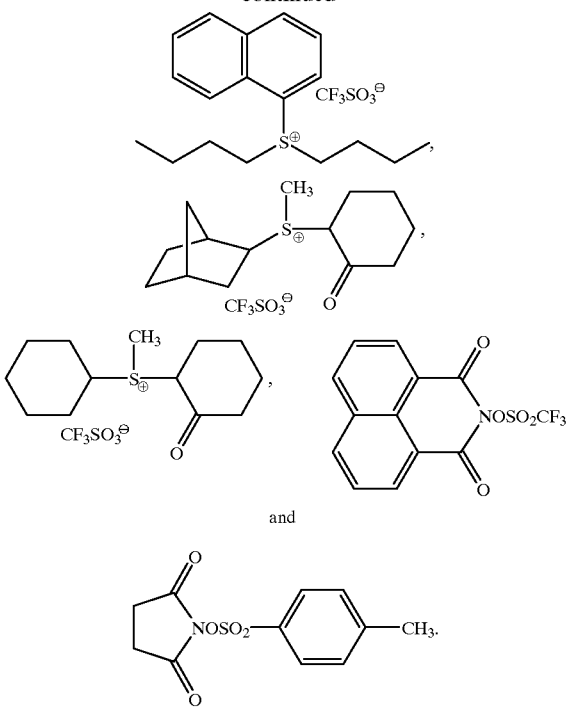

and

26. The composition of claim 25, further comprising an acid quencher, said acid quencher is selected from the group consisting of:

27. A method for the lithography of a semiconductor device wherein the composition as claimed in claim 22 is coated on a substrate and is used as a chemical amplified photoresist.

28. The method of claim 27, wherein said lithography comprises an exposure step using a light source with 248 nm or 193 nm.

* * * * *